United States Patent [19]

Seeger

[11] Patent Number: 4,794,216

[45] Date of Patent: Dec. 27, 1988

[54] CONTACT SPRING FOR A BISTABLE RELAY FOR THE SWITCHING OF HIGH CURRENT

[76] Inventor: Gunter Seeger, Heidelberger Landstr. 341, Darmstadt-Eberstadt, Fed. Rep. of Germany, 6100

[21] Appl. No.: 860,134

[22] Filed: May 6, 1986

[51] Int. Cl.⁴ ........ H01L 41/08

[52] U.S. Cl. ........ 200/275; 200/250; 200/283

[58] Field of Search ........ 200/250, 275, 237, 238, 200/239, 243, 245, 246, 283, 284, 144 R, 6 R, 6 C, 153 G; 335/151, 154, 203

[56] References Cited

U.S. PATENT DOCUMENTS

| | | | |
|---|---|---|---|
| 2,788,419 | 4/1957 | Young | 200/275 |
| 2,854,550 | 9/1958 | Gerth et al. | 200/144 R |
| 3,255,334 | 6/1966 | Fisher et al. | 200/246 |
| 4,180,715 | 12/1979 | Licthenberger | 200/246 |
| 4,278,855 | 7/1981 | Rossi | 200/275 X |
| 4,403,166 | 9/1983 | Tanaka et al. | 200/246 X |

FOREIGN PATENT DOCUMENTS

| | | | |
|---|---|---|---|
| 852708 | 7/1949 | Fed. Rep. of Germany . | |
| 1989468 | 11/1965 | Fed. Rep. of Germany . | |
| 7203317 | 1/1972 | Fed. Rep. of Germany . | |
| 8128009 | 1/1982 | Fed. Rep. of Germany . | |
| 750133 | 8/1933 | France | 200/275 |
| 913416 | 9/1946 | France | 200/275 |

*Primary Examiner*—Henry J. Recla
*Assistant Examiner*—Ernest G. Cusick
*Attorney, Agent, or Firm*—Brown, Martin, Haller & Meador

[57] ABSTRACT

A contact spring for a bistable relay for the switching of higher current will be described in which the actual contact spring is at least one stranded wire connected in parallel, which takes a part of the currents.

10 Claims, 2 Drawing Sheets

CONTACT SPRING FOR A BISTABLE RELAY FOR THE SWITCHING OF HIGH CURRENT

BACKGROUND OF THE INVENTION

The invention concerns a contact spring for a bistable relay for the switching of higher current.

During switching of high currents, for example of the order to 30 to 40 amperes, the problem arises that the actual contact spring can no longer easily accept the higher currents if the contact spring is to be flexible. For the acceptance of high currents, one has to correspondingly increase the cross-section of the contact spring which naturally means a discernible stiffening of the contact spring.

SUMMARY OF THE INVENTION

The invention applies itself to the technical problem of proposing a contact spring for a bistable relay for the switching of higher currents, which on the one hand is flexible and on the other hand permits the switching of higher currents.

One aspect of the invention is the idea of a contact spring for a bistable relay for the switching of higher currents, the spring being formed from an elongated one-piece metal plate which consists of a clamped end and a contact end, in between which a bending zone is formed. For the solution of the mentioned technical problem, this aspect of the invention is characterized in that at least one stranded wire of conducting material is provided, whose ends are connected to the clamped end and contact end respectively of the metal plate in an electrically-conducting fashion.

During use, the currents thus divide themselves between the actual metal plate and/or the stranded wire. These wires are flexible and do not discernibly or disadvantageously increase the light flexibility of the metal piece (metal plate), which can thus be formed to suit the mechanical requirements, particularly the light flexibility.

The other aspect of the invention is the idea of a contact spring for a bistable relay for the switching of higher currents which is, for the solution of the mentioned technical problem, characterized in that the contact spring consists of several superposed metal plates, which are all connected to each other at their ends. One thus achieves the necessary higher cross-section for the conducting of the higher currents in that a corresponding number of the metal plates are superposed, which are preferably cut the same, i.e. of the same profile. In spite of this, one can achieve the necessary light flexibility of the contact spring in that these superposed metal plates are not formed in one piece but are only connected together at their ends so that in the actual bending zone the metal plates are separated from each other. Geometric considerations verify that this form of construction also has a sufficient light flexibility because, to some extent, the combined contact springs have a bending stiffness which is not significantly greater than the bending stiffness of a single metal plate. This is based on the fact that the metal plates can be opposingly displaced in their central bending area. If one visualizes the metal plates unified into a single block, this opposing displacement of the metal plates would not exist and this metal block would have such a high bending stiffness that it could not be used for the purpose of the invention, namely for a bistable relay.

The first embodiment example mentioned is preferably characterized in that the bending zone is formed by an elongated strip on which each side of the strip one of the stranded wires is arranged. Here, therefore, one has at least two stranded wires which can thus accept a relatively high current.

Another embodiment example is thus characterized in that the bending zone is formed by two parallel strips spaced apart, in between which extends at least one stranded wire. This embodiment example is particularly symmetric in use and no tilting occurs during bending of the contact spring.

During use, the electrically conducting connection between the ends of the stranded wire and the actual contact spring must be able to withstand heat stress. A normal soldered joint is in this case not suitable. Thus the invention is further characterized in that the stranded wires are clamped between the two contact plates. The clamping force can be achieved by, for example, spot welding, which is preferred because of the high current transfer surfaces, or also by screws, clamps or rivets.

The invention will be further explained in the following by means of embodiment examples, from which arise further important features.

DESCRIPTION OF THE PREFERRED EMBODIMENTS

Figure 1:
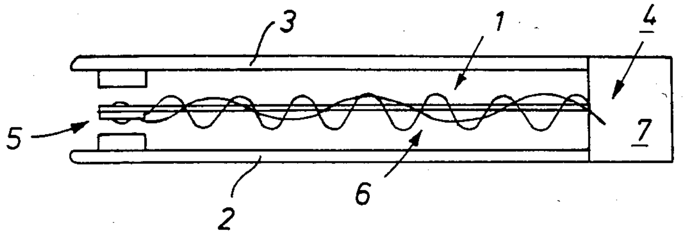
FIG. 1 is a schematic side view of a contact spring according to the invention with the relevant upper and lower opposing contacts.

FIG. 1 shows a contact spring (1) which is movable between a lower opposing contact (2) and an upper opposing contact (3). The contact spring has a clamped end (4) and a contact end (5). Between these two ends is located the bending zone of the contact spring, which is indicated by index (6). FIG. 1 shows that the clamping unites the three springs (1),(2),(3) in one block (7).

Figure 2:
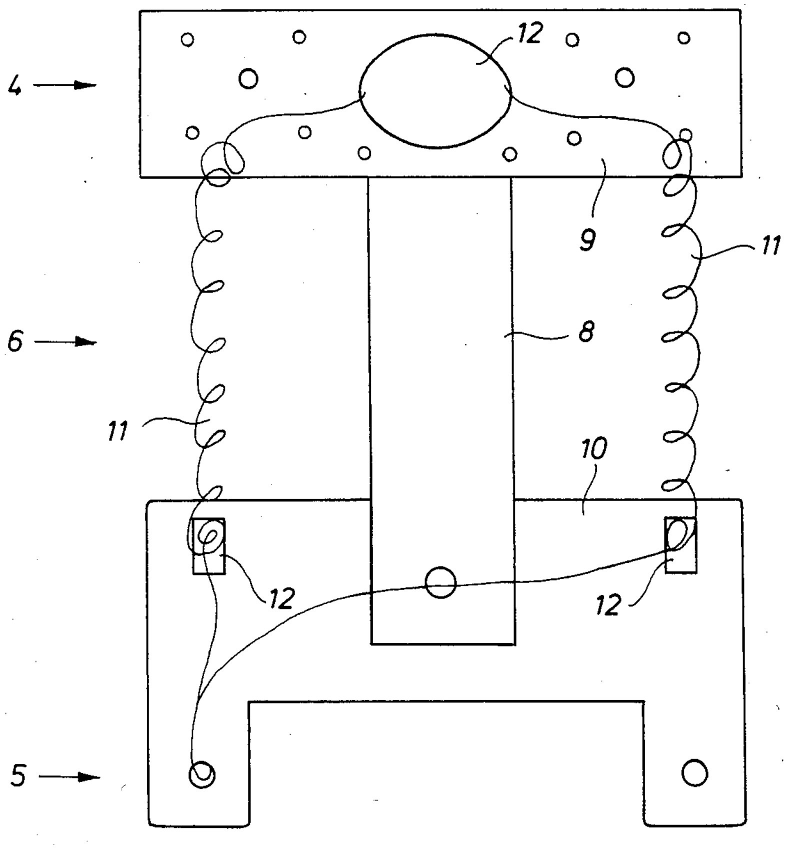
FIG. 2 is a plan view of the contact spring according to the invention, in a first embodiment example.
Figure 3:
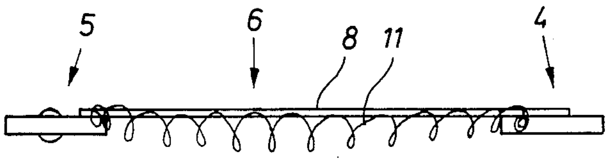
FIG. 3 is a side view of FIG. 2.

FIGS. 2 and 3 show details of the contact spring (1). In this embodiment example it has an H-shaped profile, in which the bending zone (6) is formed by an elongated strip (8) which is connected with two transverse elongated metal strips (9), (10) to form one piece. The leading transverse strip (10) is extended to a forked-end on which the contacts of the contact zone (5) are formed.

In accordance with the invention, the mechanical properties, in particular the bending properties of the strip (8) in the bending zone (6), are so formed that the necessary light flexibility for a bistable relay is available. However, in order to be able to accept higher currents of the order of 25 amperes, two stranded wires (11) in electrical parallel to the strip (8) are provided, whose ends are suitably connected to the transverse strip (9), (10). The stranded wires concerned are either twisted or in strands, whose ends are electrically connected to the material of the actual contact spring (8), (9), (10) by an additional contact plate or terminal (12). Preferably a spot weld is provided here.

Figure 4:
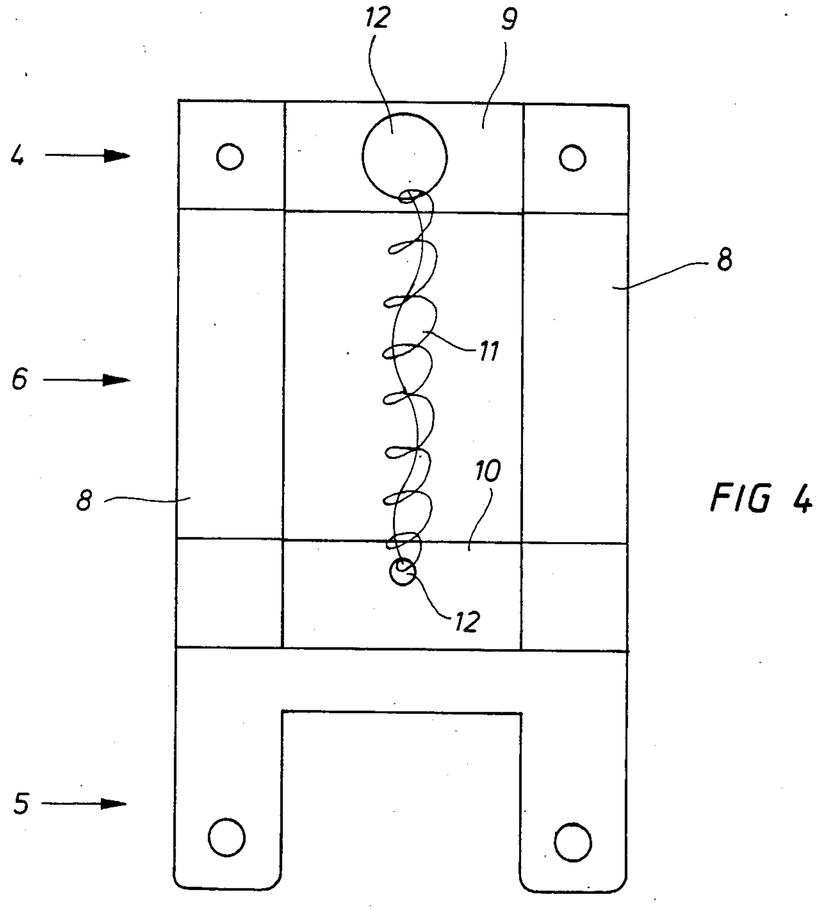
FIG. 4 is a plan view corresponding to FIG. 2 of a second embodiment example.

In the case of the embodiment example shown in FIG. 4, the H-profile of FIG. 2 is replaced by a box profile with two of the strips (8) provided which are secured to the transverse strips (9), (10) parallel to each other and spaced apart. Here at least one stranded wire (11) is provided approximately centrally disposed between the transverse strips (9), (10) and thus connected in parallel to the elongated strip (8). This embodiment example stands out by having particularly good torsional stiffness and torsional stability, because the contact is better guided. Apart from this, fewer terminals (12) are provided than in the case of the first embodiment example in accordance with FIG. 2.

Figure 5:
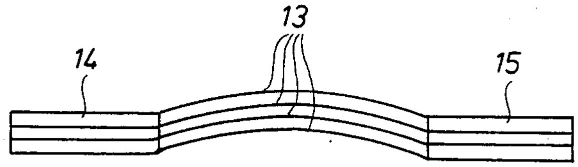
FIG. 5 is a side view corresponding to FIG. 3 of a further embodiment example in which several metal plates are superposed.

The third embodiment example according to FIG. 5, uses the second principle mentioned in which, without the stranded wires (11) several, preferably uniform metal plates (13), are superposed. They are connected together at their ends to form a clamped end (14) and a contact end (15) by, for example, welding.

Usages for the invention are to be seen in all cases where one requires to conduct higher currents through conductors, in which a specific predetermined flexibility of the conductor or the actual conductor is to be retained, so this can reach one or two end positions.

What I claim is:

1. In a contact spring for a bistable relay for the switching of high amperage electrical currents, which consists of a metal plate with one clamped end and one contact end, between which a bending zone is formed by a first elongated metal strip connected to and extending between said clamped end and said contact end, said contact end including a second elongated metal strip transversely connected to said first elongated metal strip at said contact end of said first elongated metal strip, the improvement comprising:
   at least one stranded wire (11) in said bending zone substantially parallel to and laterally spaced from said first metal strip (8) and electrically connected to said clamped end (4) and to said second metal strip at said contact end (5).

2. The improved contact spring of claim 1, wherein said bending zone is formed by a single elongated metal strip (8) on either side of which is disposed one of said stranded wires, said single elongated metal strip forming an H-shaped profile with said clamped end and said second metal strip.

3. The improved contact spring of claim 1, wherein said bending zone is formed by two spaced-apart, parallel elongated metal strips between which is disposed one of said stranded wires, said two spaced-apart, parallel elongated metal strips forming a box profile with said clamped end and said second elongated metal strip.

4. The improved contact spring of claim 1, wherein said contact end comprises a contact plate attached to said second elongated metal strip, said at least one stranded wire being clamped between said contact plate and said second metal strip.

5. The improved contact spring of claim 4 wherein said contact plate is welded to said second metal strip.

6. A contact spring for a bistable relay which switches high-amperage electrical currents, comprising:
   a clamping end;
   a contact end including an elongated metal contact strip;
   an elongated, bendable metal strip having two ends, said clamping end being connected to a first one of said ends and said contact strip being transversely connected to the second one of said ends, said bendable metal strip forming a bending zone between said clamping end and said contact end; and
   an electrically conductive, stranded wire disposed substantially parallel to and laterally spaced apart from said bendable metal strip in said bending zone and connected electrically to said clamping end and said contact strip.

7. The contact spring of claim 6, wherein said clamping end comprises an elongated metal clamping strip disposed transversely to said bendable metal strip.

8. The contact spring of claim 7, wherein said clamping strip, said bendable strip, and said contact strip form an H-shaped profile, and further including two of said stranded wires, each of said stranded wires disposed in said bending zone, laterally to said bendable metal strip and connected to said contact strip and to said clamping strip.

9. The contact spring of claim 7, further including a second bendable metal strip, substantially parallel to and spaced apart from said bendable metal strip and connected to said clamping strip and to said contact strip to form a box profile, and wherein said stranded wire is disposed between said bendable metal strips.

10. The contact spring of claim 7 further including a contact plate fastened to said contact strip and wherein said stranded wire is clamped between said contact plate and said contact strip.

* * * * *